US010319422B2

(12) United States Patent
Huffman

(10) Patent No.: US 10,319,422 B2
(45) Date of Patent: Jun. 11, 2019

(54) LOW POWER DECODER USING RESONANT DRIVE CIRCUITRY

(71) Applicant: Power Down Semiconductor Inc., Fremont, CA (US)

(72) Inventor: David A. Huffman, Fremont, CA (US)

( * ) Notice: Subject to any disclaimer, the term of this patent is extended or adjusted under 35 U.S.C. 154(b) by 0 days.

(21) Appl. No.: 15/746,553

(22) PCT Filed: Jul. 26, 2016

(86) PCT No.: PCT/US2016/044125
§ 371 (c)(1),
(2) Date: Jan. 22, 2018

(87) PCT Pub. No.: WO2017/019714
PCT Pub. Date: Feb. 2, 2017

(65) Prior Publication Data
US 2018/0211698 A1    Jul. 26, 2018

Related U.S. Application Data

(60) Provisional application No. 62/282,214, filed on Jul. 27, 2015.

(51) Int. Cl.
*G11C 8/10* (2006.01)
*G11C 11/418* (2006.01)
(Continued)

(52) U.S. Cl.
CPC ............ *G11C 8/10* (2013.01); *G11C 8/18* (2013.01); *G11C 11/418* (2013.01);
(Continued)

(58) Field of Classification Search
CPC .......... G11C 8/10; G11C 8/18; G11C 11/418; G11C 5/148; H03B 5/1215; H03B 5/1228; H03B 5/1231; H03B 5/32; H03B 5/36
(Continued)

(56) References Cited

U.S. PATENT DOCUMENTS

| 4,758,746 A | 7/1988 | Birkner et al. |
| 5,734,285 A * | 3/1998 | Harvey ................. H03K 3/037 327/291 |

(Continued)

OTHER PUBLICATIONS

Yong Moon, Deog-Kyoon Jeong, "An Efficient Charge Recovery Logic Circuit", IEEE Journal of Solid-State Circuits, vol. 31, Issue 4, Apr. 1996.

Dragan Maksimovic and Vojin G. Oklobdzija, "Integrated Power Clock Generators for Low Energy Logic", Power Electronics Specialists Conference, 1995, PESC '95 Record., 26th Annual IEEE.

*Primary Examiner* — Alexander Sofocleous
*Assistant Examiner* — Alfredo Bermudez Lozada

(57) ABSTRACT

A decoder according to one embodiment of the invention includes a set of lines, a resonator circuit, a set of input leads for receiving input signals, and a set of switches for coupling some of the lines within the set of lines to the resonator circuit in response to the input signals while the other lines within the set of lines are at a first binary voltage. The lines are coupled to a set of pointer circuits. The pointer circuits perform logic functions on the signals on the lines when the resonating signal is at a second binary voltage opposite the first binary voltage to thereby decode the input signals. Because the lines are driven high and low by a resonator circuit, the decoder circuit power consumption is less than it would be if the lines were pulled up and down by a set of pullup and pulldown transistors.

12 Claims, 16 Drawing Sheets

(51) Int. Cl.
  *H03B 5/12* (2006.01)
  *H03B 5/36* (2006.01)
  *G11C 8/18* (2006.01)
  *H03B 5/32* (2006.01)

(52) U.S. Cl.
  CPC ......... *H03B 5/1215* (2013.01); *H03B 5/1228* (2013.01); *H03B 5/1231* (2013.01); *H03B 5/32* (2013.01); *H03B 5/36* (2013.01); *H03B 2200/0062* (2013.01)

(58) Field of Classification Search
  USPC .............................. 365/230.06, 230.05, 226
  See application file for complete search history.

(56) References Cited

U.S. PATENT DOCUMENTS

| | | | |
|---|---|---|---|
| 5,796,656 A | | 8/1998 | Kowshik et al. |
| 6,044,035 A | * | 3/2000 | Kohno ..................... G11C 8/08 365/189.09 |
| 7,183,868 B1 | | 2/2007 | Wessendorf |
| 7,227,806 B2 | | 6/2007 | Abidifard |
| 7,940,555 B2 | | 5/2011 | deSandre |
| 2010/0165779 A1 | * | 7/2010 | Zhang ..................... G11C 8/08 365/230.06 |
| 2012/0266002 A1 | * | 10/2012 | Kim ........................ G11C 7/22 713/320 |
| 2015/0138867 A1 | | 5/2015 | Kirihata et al. |

\* cited by examiner

| INPUT | | | OUTPUT | | | | | | | |
|---|---|---|---|---|---|---|---|---|---|---|
| $A_2$ | $A_1$ | $A_0$ | $W_0$ | $W_1$ | $W_2$ | $W_3$ | $W_4$ | $W_5$ | $W_6$ | $W_7$ |
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

LOW POWER DECODER USING RESONANT DRIVE CIRCUITRY

CROSS-REFERENCE TO RELATED APPLICATIONS

This application claims the benefit of priority to U.S. Provisional Application Ser. No. 62/282,214, entitled "A Low Power Decoder Using Resonant Drive Circuitry," filed Jul. 27, 2015, the contents of which are incorporated by reference.

BACKGROUND OF THE INVENTION

A decoder circuit typically takes an encoded value signal and converts it into a different form. The encoded signal can be more or less efficient in terms of complexity than the decoded signal. An example of encoded signals that are less efficient (meaning more bits to represent a simpler set of binary values) are those used for encryption. An example of a more efficient coding scheme would be binary encoding where a binary value represents the position of a pointer to an array of stored values. Binary value 000 would represent position 0, binary value 100 would represent position 4, etc. There would be $2^N$ positions decoded from an N-bit binary value. There are many types of decoders in the prior art.

The present invention relates to binary decoders such as those used as pointers to an array of memory locations. The present invention also relates to methods for decoding digital values such as addresses. The invention also relates to decoders and methods for decoding used in other applications.

Computer integrated circuit chips (or ICs) commonly have decoders which point to locations or addresses of a memory such as a static random access memory (or SRAM). These address decoders are typically binary encoded and access the entire memory array such that each encoded binary value points to a unique memory location. FIG. 1 shows the architecture of an SRAM 10 having a 3-bit address bus for receiving signals $A_0$ to $A_2$ respectively, which is decoded by a decoder 12 to provide signals on eight pointer or word leads $W_0$ to $W_7$. Each word lead W provides a signal to enable a particular row $R_0$ to $R_7$ of bit cells 14 containing a memory location or which allows that word to be written to or read from depending on additional control logic.

FIG. 2 illustrates prior art 3 to 8 address decoder 12 constructed at the gate level. Address decoder 12 receives address signals $A_0$ to $A_2$ and provides both inverted and non-inverted address signals on lines 16-0 to 16-5, which in turn are provided to a set of AND gates 8-0 to 8-7, which serve as pointer circuits to generate therefrom the signals on pointer leads $W_0$ to $W_7$. FIG. 3 is a truth table that indicates which output word lead $W_0$ to $W_7$ is driven high for each combination of address bits.

Although SRAM 10 receives only three address signals and has eight rows, typical SRAMs receive more than three address signals and have more than eight rows. Therefore, typical SRAMs have a greater length than SRAM 10, and their decoders have a greater length than decoder 12. Since decoder 12 and lines 16 span the entire height of the array, for larger arrays, lines 16 are considerably capacitive. Because lines 16 are driven continuously with new address values, the capacitance of lines 16 is continuously charged and discharged, and the decoder power consumption significantly contributes to the overall power consumed by SRAM 10. For example, when one of intermediate lines 16 is discharged from a high binary voltage to ground by a conventional CMOS circuit, an amount of energy equal to ½ $C_{16}V^2$ is consumed (where $C_{16}$ is the capacitance of that line and V is the voltage on that line prior to being discharged). (The amount of power dissipated is $C_{16}V^2F$, where F is the switching frequency.) One object of this invention is to provide a novel decoder and method that exhibit reduced power consumption.

SUMMARY

A decoder constructed in accordance with the invention comprises a set of lines for carrying information, e.g. information corresponding to an address. A resonating signal is applied to at least some of the lines. In one embodiment, at a selected time, a set of pointer circuits decodes the information contained on these lines to generate therefrom one or more decoder output signals.

In one embodiment, some of the lines carry the resonating signal while the other lines are at a first binary voltage level. The pointer circuits decode the signals on the lines when the resonating signal is at a second binary voltage level opposite the first binary voltage level.

In one embodiment, the pointer circuits are also coupled to a strobe signal which goes active when the resonating signal is at the second binary voltage level to thereby cause the pointer circuits to decode the signals on the lines when the resonating signal is at the second binary voltage level.

In one embodiment, the first binary voltage level is a binary low voltage level and the second binary voltage level is a high binary voltage level. In another embodiment, the first binary voltage level is a binary high voltage level and the second binary voltage level is a binary low voltage level.

In one embodiment, the resonating signal is provided by a resonator circuit. A set of switches either couple or decouple the lines within the set from the resonator circuit. These switches change state when the resonating signal is at the first binary voltage level. Because the voltage on the set of lines is increased and decreased by a resonator circuit, the process of raising and lowering the voltage on these lines consumes less power than if the lines were pulled up and down by transistors connected between the lines and a DC power supply or between the lines and ground.

In one embodiment, when the address changes, the switches change state when the resonating signal is at the first binary voltage level. The number of lines coupled to the resonator circuit at any one time does not change, and thus the capacitive loading coupled to the resonator circuit stays substantially the same. The capacitive loading cooperates with the resonator circuit to establish the frequency of the resonating signal. Since the number of lines coupled to the resonator circuit does not change when the address changes, the frequency of the resonating signal does not change.

In one embodiment, the decoder is an address decoder for a memory such as an SRAM, DRAM, ROM, EEPROM or flash memory.

A method in accordance with the invention comprises applying a resonating signal to some lines within a set of lines within a decoder and providing those signals to a set of pointer circuits that generate a decoded output signal in response thereto.

In one embodiment, the method further comprises applying a first binary voltage to those lines within the set that do not receive the resonating signal. A strobe signal is applied to the pointer circuits to enable the pointer circuits to generate a decoded output signal.

In one embodiment, the method further comprises receiving an address, selecting some of the lines within the set of lines to receive the resonating signal in response to the address, and selecting other lines within the set of lines to receive the first binary voltage in response to the address.

In one embodiment, the method comprises applying the strobe signal at a time when the resonating signal is at a second binary voltage opposite the first binary voltage.

In one embodiment, the method further comprises generating the resonating signal with a resonant circuit. The lines exhibit capacitance. The capacitance of the lines coupled to receive the resonating signal cooperates with the resonant circuit to establish the frequency of the resonating signal.

DETAILED DESCRIPTION

Figure 1:
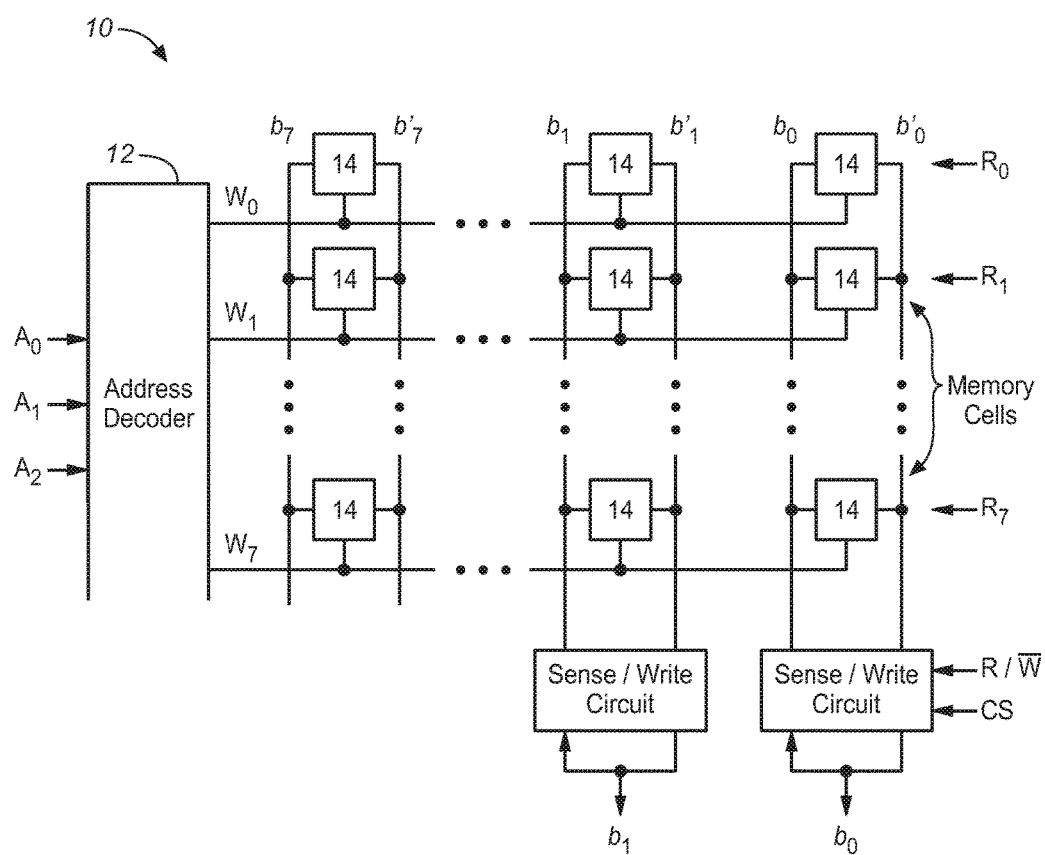
FIG. 1 schematically illustrates a prior art simplified block diagram of the internal organization of an SRAM.
Figures 2, 3:
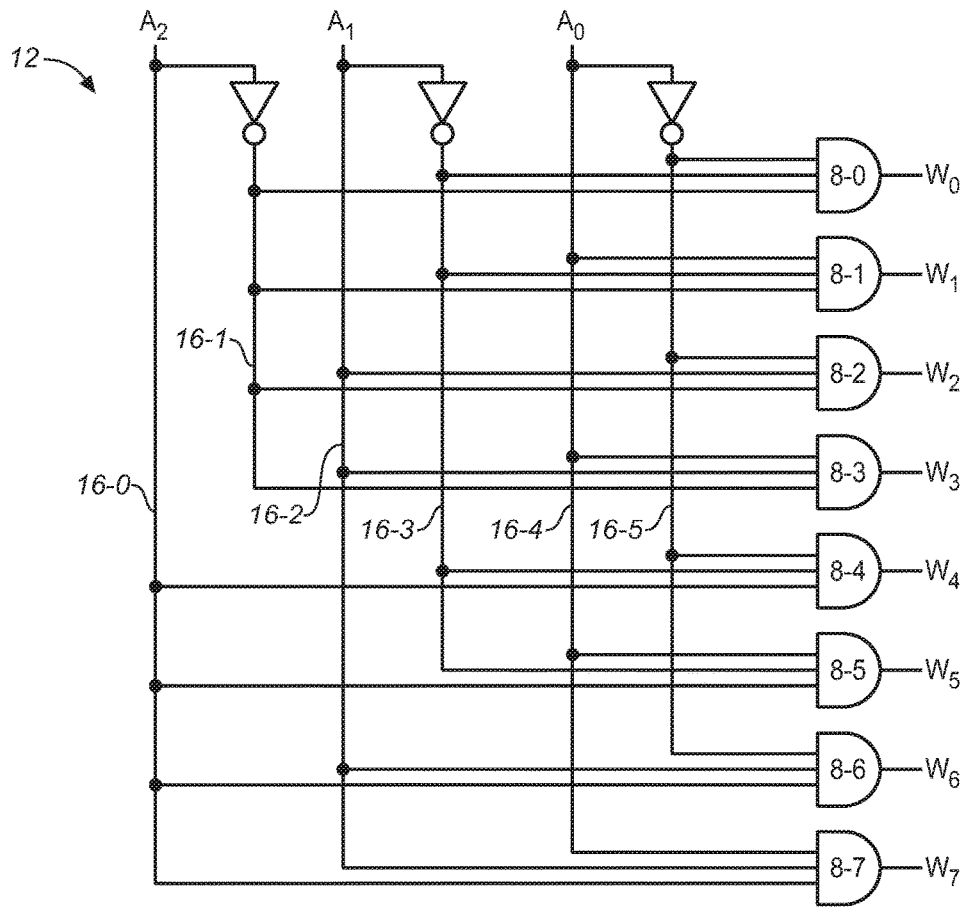
FIG. 2 schematically illustrates a prior art 3-to-8 decoder.
FIG. 3 shows a truth table for the 3-to-8 binary decoder.
Figure 4:
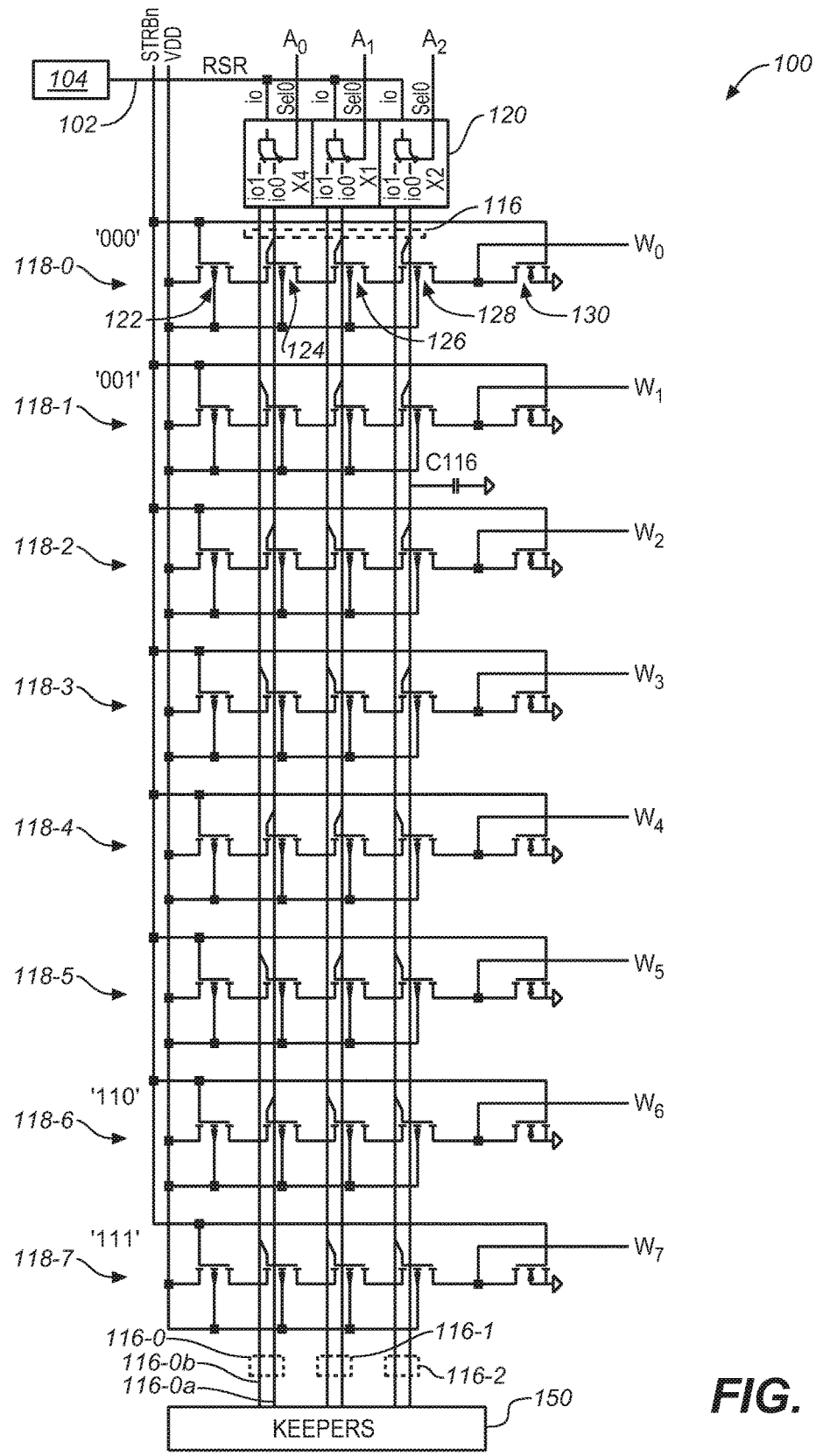
FIG. 4 illustrates a 3-to-8 decoder constructed in accordance with the invention.
Figure 5:
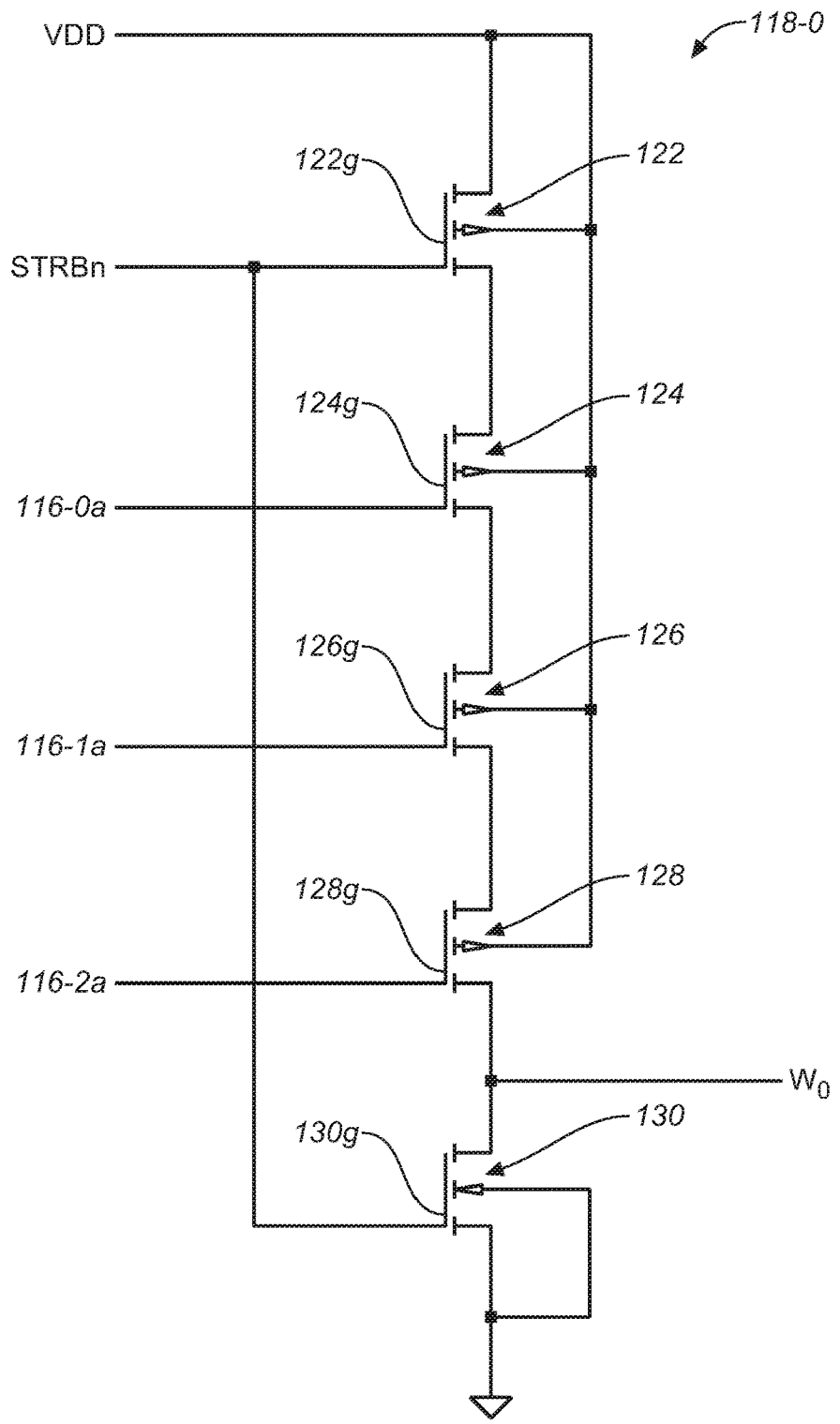
FIG. 5 illustrates dynamic gate 118-0 within the decoder of FIG. 4.

FIG. 4 illustrates a 3 to 8 decoder 100 constructed in accordance with my invention. Decoder 100 receives three input signals $A_0$ to $A_2$ and in response thereto generates a set of intermediate signals on intermediate leads 116. A set of MOS dynamic gates 118-0 to 118-7 (functioning as pointer circuits) receives the signals on intermediate leads 116 and asserts a decoder output signal on a selected one of leads $W_0$ to $W_7$ in response thereto. A single one of dynamic gates 118 (dynamic gate 118-0) is shown in FIG. 5.

In one embodiment, leads $W_0$ to $W_7$ are coupled to an array of SRAM cells to select a row of SRAM cells. In this description, signals $A_0$ to $A_2$ will be referred to as address signals, and leads $W_0$ to $W_7$ will be referred to as word lines. However, in other embodiments, decoder 100 is used in other applications. In such applications, signals $A_0$ to $A_2$ need not be addresses, and the signals on leads $W_0$ to $W_7$ need not point to rows of memory cells.

Figure 4A:
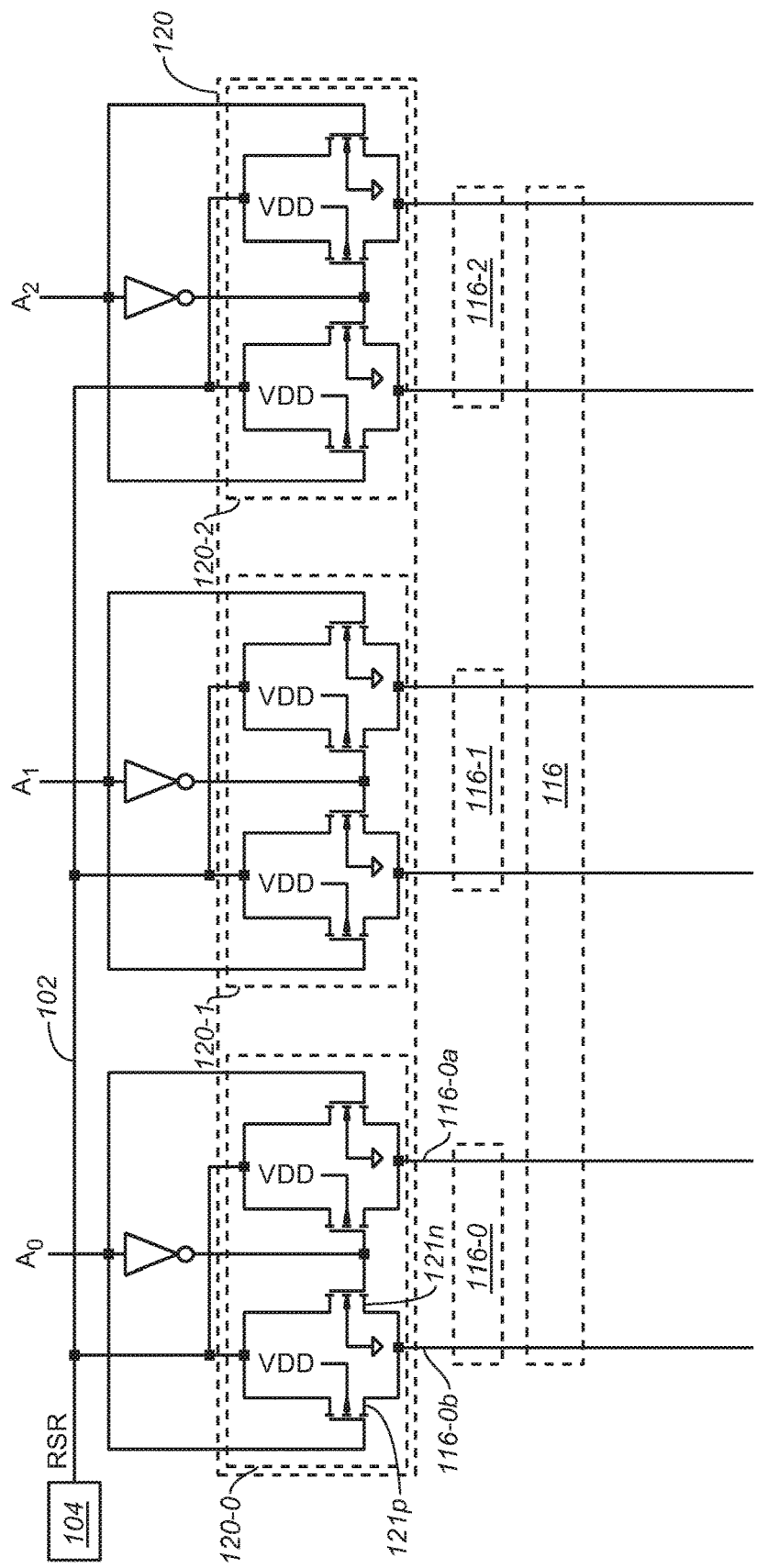
FIG. 4a illustrates a set of switches within the decoder of FIG. 4.

Intermediate leads 116 are coupled to a set of switches 120. As shown in FIG. 4, leads 116 are divided into pairs, i.e. pairs 116-0 to 116-2, each pair corresponding to a pair of switches 120-0 to 120-2 and one of address signals $A_0$ to $A_2$ (see FIG. 4a). In one embodiment, each of switches 120 is implemented as a pair of transistors, e.g. PMOS transistor 121p and NMOS transistor 121n, driven by signal $A_0$ and the logical inverse of signal $A_0$, respectively.

Figure 4B:
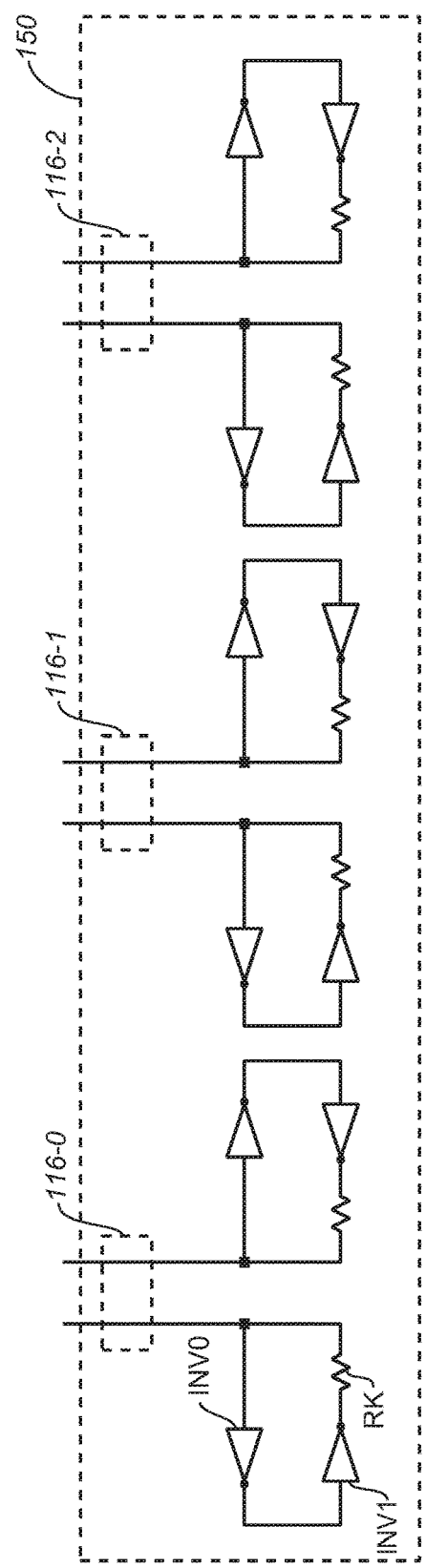
FIG. 4b illustrates a set of keeper circuits within the decoder of FIG. 4.

Decoder 100 also includes a resonating input signal lead 102 for receiving a resonating signal RSR (typically a sinusoid) from a resonant circuit 104. Switches 120-0 couple resonating input signal lead 102 to either a first one of the intermediate leads 116-0a within the pair 116-0 or a second one of the intermediate leads 116-0b in response to corresponding binary address signal $A_0$. Switches 120-1 and 120-2 similarly couple resonating input signal lead 102 to a corresponding intermediate lead within pairs 116-1 and 116-2 in response to corresponding address signals $A_1$ and $A_2$. Accordingly, at any given time, half of intermediate leads 116 carry resonating signal RSR and the other half of intermediate leads 116 are held at ground by keeper circuits 150 (FIGS. 4 and 4b).

Each of dynamic gates 118 contains four PMOS pull-up transistors 122, 124, 126 and 128 and an NMOS pull-down transistor 130. The gates of transistors 122 and 130 receive an active low strobe signal STRBn when it is desired to cause decoder 100 to select and drive one of word lines W. The gates of transistors 124, 126 and 128 are hard-wired to receive the various permutations of intermediate leads within pairs 116-0 to 116-2 such that if the signals on leads 116 were purely digital, and the signals on leads 116 contained inverted and non-inverted address signals $A_0$ to $A_2$, dynamic gates 118 would perform a digital 3 to 8 decoder function.

When it is desired to actuate decoder 100, strobe signal STRBn is asserted low. (The output signals of all of dynamic gates 118 are always low when strobe signal STRBn is high.) Of importance, strobe signal STRBn is only low when resonating signal RSR is near or at its peak voltage and high enough such that the PMOS devices of dynamic gates 118 are in their subthreshold region of operation or completely off. Accordingly, when strobe signal STRBn is low, the signal on leads 116 that are coupled to receive resonating signal RSR is treated by dynamic gates 118 as a binary 1. Since the leads that do not receive resonating signal RSR are held at ground (i.e. binary 0), dynamic gates 118 function logically as NAND gates. Only one of dynamic gates 118 will have all of the gates of its transistors 124, 126 and 128 held low, and only that one dynamic gate 118 will raise its output signal high, and therefore only one word line W will be selected. (The manner in which those leads 116 that do not receive resonating signal RSR are held at ground is described below.)

Figure 6:
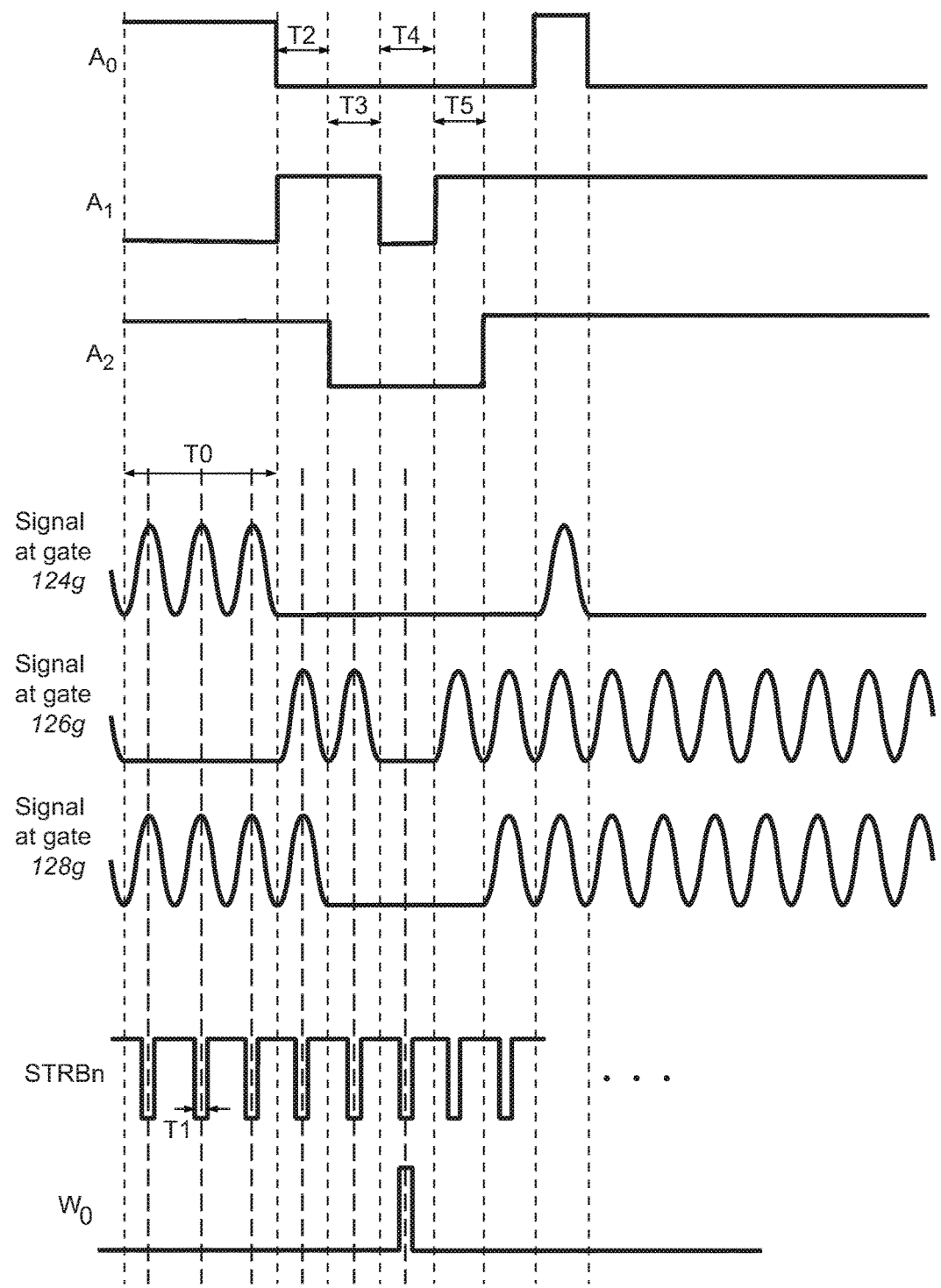
FIG. 6 is a timing diagram of signals within dynamic gate 118-0 of the decoder of FIGS. 4 and 5.

FIG. 5 an expanded schematic diagram of dynamic gate 118-0. FIG. 6 is a timing diagram illustrating the relation of address signals $A_0$, $A_1$, $A_2$, the signal at the gates 124g, 126g and 128g of transistors 124, 126 and 128 within dynamic gate 118-0, strobe signal STRBn, and the output signal on word line $W_0$. During a time T0, signals $A_0$ and $A_2$ are high while signal $A_1$ is low. Accordingly, switches 120-0 and 120-2 apply resonating signal RSR to leads 116-0a and 116-2a, which in turn apply signal RSR to gates 124g and 128g within dynamic gate 118-0. Lead 116-1a is at 0 volts, which in turn applies 0 volts to gate 126g of transistor 126 within dynamic gate 118-0. Signal STRBn only goes low during a brief time period T1 within time T0. Prior to time T1, signal STRBn keeps transistor 122 off and transistor 130 on, and therefore line $W_0$ is held at ground by transistor 130.

At time T1, since resonating signal RSR is high when signal STRBn goes low, gates 124g of transistor 124 and 128g of transistor 128 are high, transistors 124 and 126 are off during time T1 and the output signal of dynamic gate 118-0 is low during time T1. (Although there is no path for connecting a binary high or low voltage to word line $W_0$ during time T1, the capacitance of line $W_0$ keeps line $W_0$ at ground during time T1.)

At the end of time T0 (the beginning of time T2), signals $A_0$ and $A_1$ switch state. Signal $A_0$ goes low and signal $A_1$ goes high. Accordingly, gate 124g is held at ground while gate 126g receives resonating signal RSR. This means that transistor 124 remains on during time T2. However, when strobe signal STRBn goes low during time T2, signal RSR is high, gates 126g and 128g are at a high voltage, transistors 126 and 128 are off, and therefore the output signal on lead $W_0$ remains low.

At the end of time T2 (the beginning of time T3), signal $A_2$ goes low. Therefore, the signal at gate 128g goes low and transistor 128 remains on during time T3. However, when strobe signal STRBn goes low during time T3, signal RSR is high, the voltage at gate 128g is high, and transistor 128 remains off. Therefore, the signal on lead $W_0$ remains low during time T3.

At the end of time T3 (the beginning of time T4), signal $A_1$ goes low. Therefore, the gates 124g, 126g and 128g of transistors 124, 126 and 128 are all low, and transistors 124, 126 and 128 are all on. Therefore, as soon as strobe signal STRBn goes low, transistor 122 turns on, transistor 130 turns off, and the output signal on lead $W_0$ goes high. (For an embodiment in which decoder 100 is used to select a row of cells, the row of cells corresponding to lead $W_0$ is selected.)

At the end of time T4, signal $A_1$ goes high. Thereafter, at least one of address signals $A_0$, $A_1$ or $A_2$ are high, at least one of leads 116-0a, 116-1a or 116-2a is coupled to receive resonating signal RSR, at least one of gates 124g, 126g or 128g are high during the time signal STRBn is low, at least one of transistors 124, 126 or 128 is off during the time signal STRBn is low, and the output signal of dynamic gate 118-0 on lead $W_0$ remains low.

Keeping Leads 116 Low when they are Not Coupled to Receive Resonating Signal RSR Switches 120 change state only when resonating signal RSR is at a binary 0 voltage level. Accordingly, at the start of time T2, when address signal $A_0$ goes low, lead 116-0a is approximately at ground potential when switches 120-0 decouple lead 116-0a from signal RSR. Although lead 116-0a has a capacitance which would keep lead 116-0a low for at least a while thereafter, in one embodiment, each of leads 116 are coupled to a keeper circuit 150 (FIG. 4). In one embodiment, keeper circuit 150 comprises two inverters INV0, INV1 (see FIG. 4b). Inverter INV1 is typically weak, i.e. the transistors within inverter INV1 are small and very resistive, even when on. Keeper circuits 150 maintain leads 116 low when no other devices or voltage sources are driving leads 116, i.e. when they are not coupled to receive signal RSR. Keeper circuits 150 typically draw only a very small current to overcome leakage current, e.g. about 2 nA. Thus, very little power is consumed even when keeper circuits 150 and resonant circuit 104 simultaneously drive a word line. (Keeper circuits 150 also contain resistors RK to further minimize energy loss caused by contention between inverter INV1 and signal RSR.)

Figure 7:
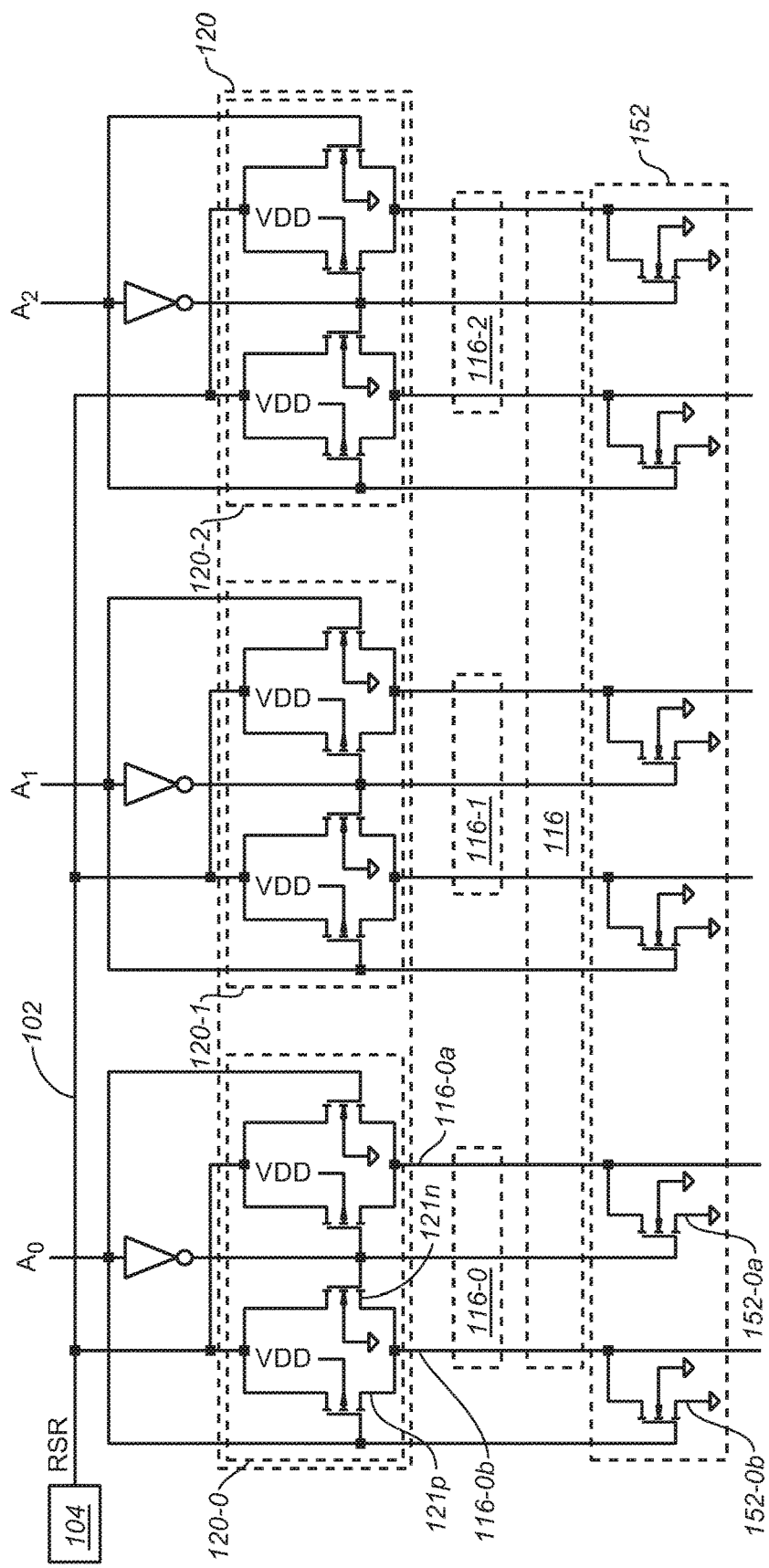
FIG. 7 illustrates a portion of an alternative embodiment of a decoder using switches to keep lines within the decoder grounded when they are not driven by a resonant circuit.

In other embodiments, other devices can be used in lieu of inverters INV0, INV1 for keeper circuits 150. For example, in one embodiment a set of switches 152 are provided (FIG. 7) for grounding leads 116 when leads 116 are not coupled to receive signal RSR. Thus, when signal $A_0$ is low, a first one of switches 120-0 couples lead 116-0b to receive signal RSR, but when signal $A_0$ is high, one of the switches within switches 152 (switch 152-0b controlled by signal $A_0$) grounds lead 116-0b. Each of switches 152 is controlled by one of signals $A_0$ to $A_2$ or the logical inverse of one of signals $A_0$ to $A_2$.

Alternatively, a large resistor (not shown) can be provided between leads 116 and ground. Such a resistor will not draw significant current when signal RSR is high and applied to leads 116, but will suffice to keep leads 116 at ground when they are not coupled to receive signal RSR.

Resonant Circuits

Figure 10:
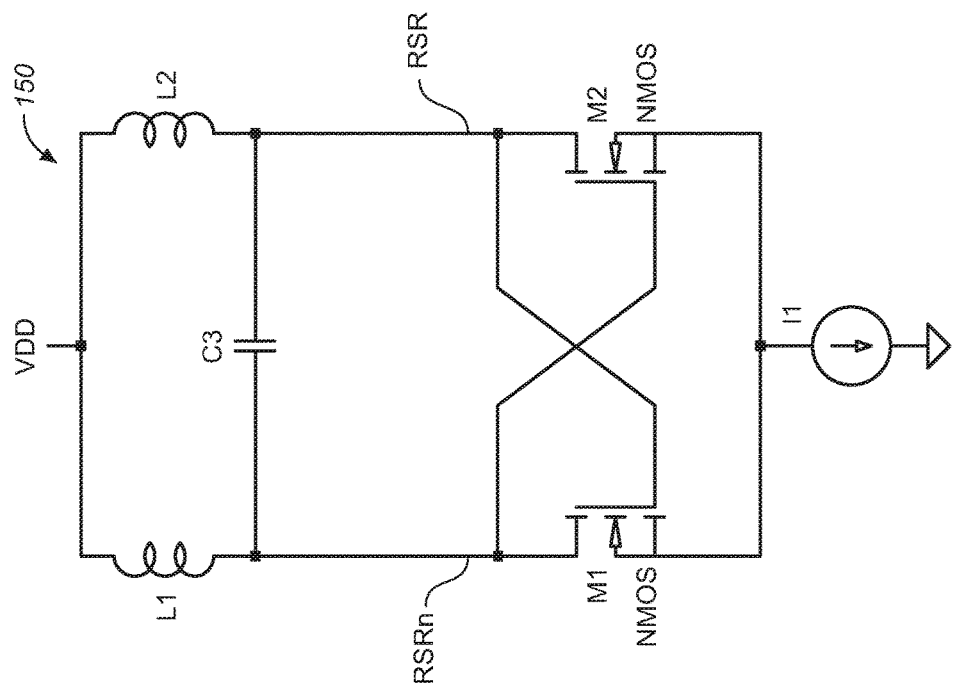
FIG. 10 illustrates an LC resonating circuit using MOS transistors.
Figure 9:
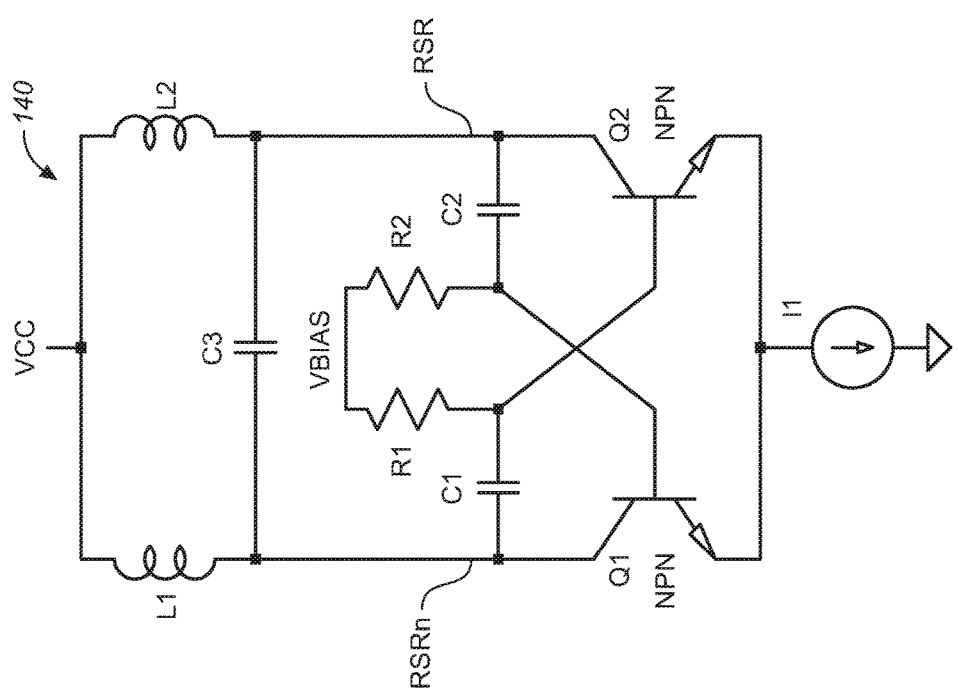
FIG. 9 illustrates an LC resonating circuit using bipolar transistors.

As mentioned above, resonant circuit 104 is used to drive the leads 116. A resonant circuit typically comprises an inductor and capacitor in a series or parallel configuration. FIGS. 9 and 10 illustrate examples of resonators 140 and 150 comprising inductors and capacitors, and using bipolar and MOS transistors, respectively. LC resonant circuits are well-known in the art. Resonators 140, 150 or other conventional resonant circuits can be used for resonant circuit 104. (In alternative embodiments, a separate capacitor C3 unnecessary and instead, resonators 140, 150 cooperate with the capacitance of lines 116 coupled to the resonators to enable resonance.)

With capacitors, energy is stored in the electric field across the two plates. With inductors, energy is stored in magnetic flux linkages which circulate around the wire carrying current. By connecting the capacitor and inductor in series or parallel, a "tank" circuit can be created whereby energy can be alternately stored either on the capacitor or the inductor as current moves charge back and forth between the two components. When the current equals zero, the energy is stored in the capacitor reaches a peak and the energy stored in the inductor is at a minimum. When the current reaches a peak the energy stored in the magnetic flux linkages of the inductor reaches a peak and the energy stored in the capacitor reaches a minimum. The only energy losses (neglecting "radiant" energy) come from heat dissipation from any parasitic resistance found in the signal path. In contrast, all of the energy associated with a capacitance switching from supply potential to ground potential is lost to heat (e.g. as is caused when CMOS transistors charge and discharge capacitance associated with a line by connecting that line to a binary one voltage source and then a binary zero voltage source).

As mentioned above, leads 116 exhibit capacitance symbolically illustrated as capacitance $C_{116}$ (FIG. 4). Thus, if leads 116 were driven high and low by conventional prior art CMOS circuits, decoder 100 would exhibit power loss that is avoided by driving leads 116 with a resonant circuit.

The total capacitance of those leads 116 that are coupled to resonant circuit 104 at any given time cooperate with resonant circuit 104 to establish the frequency of signal RSR. Because the number of leads 116 coupled to resonant circuit 104 is generally constant (as half of leads 116 are coupled to resonant circuit 104 at any given time), the total capacitance of those lines coupled to resonant circuit 104 is constant, and thus the frequency of signal RSR doesn't change as the signals on lines $A_0$ to $A_2$ change.

Figure 11:
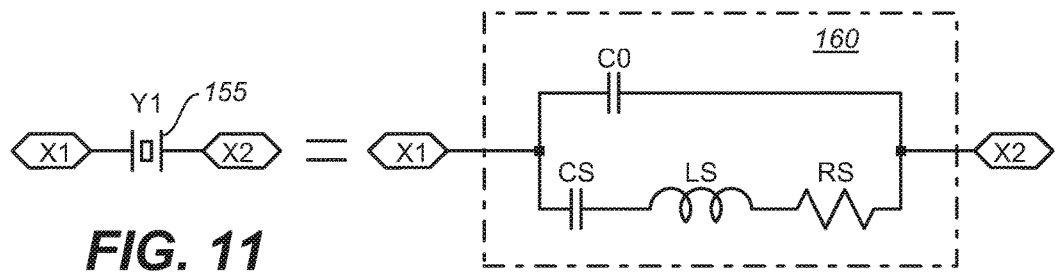
FIG. 11 illustrates the LC equivalent resonant circuit of a typical quartz crystal used in oscillators.
Figure 12:
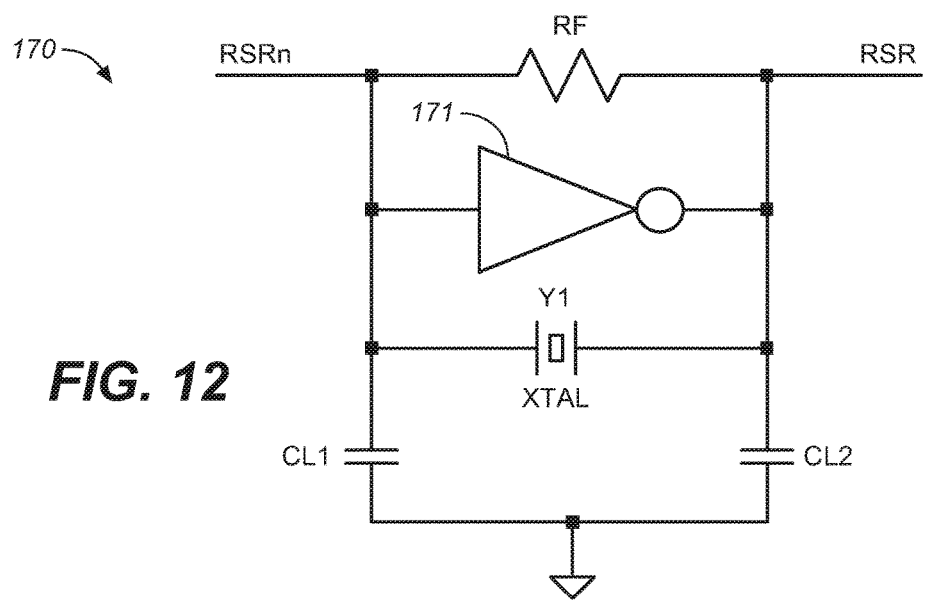
FIG. 12 illustrates an embodiment of a crystal resonating circuit.
Figure 13:
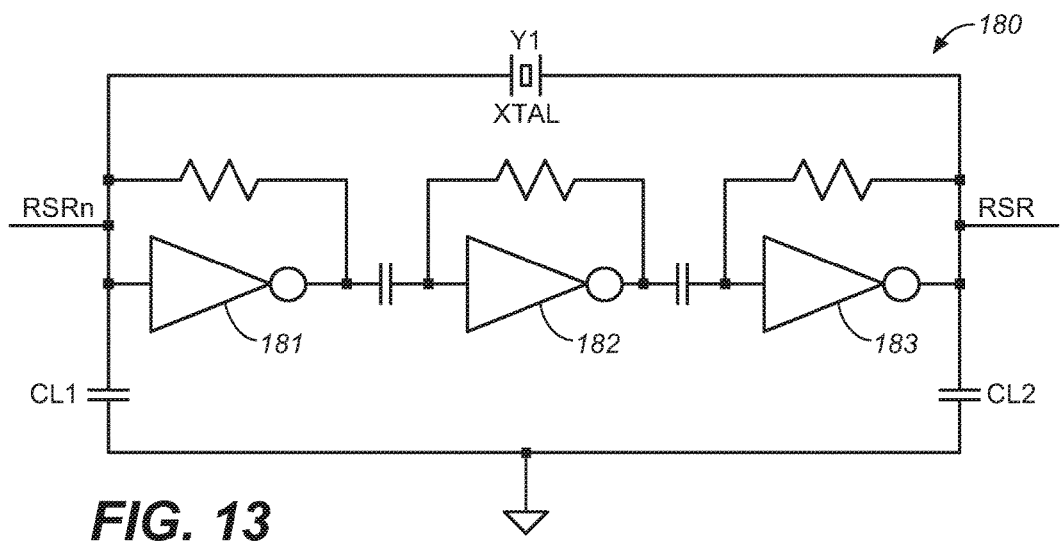
FIG. 13 illustrates another embodiment of a crystal resonating circuit.

A crystal can also be used to resonate in a resonant circuit although that aspect of its behavior that can be modelled as an inductor does not come from a coil. but rather the "motional" inductance of the crystal mass which vibrates when electrically stimulated. One type of well-known crystal resonant circuit is a Pierce Oscillator. FIG. 11 shows a crystal 155 and RLC equivalent circuit 160. Both the inductor and the capacitor are "energy-storing" elements. (FIGS. 12 and 13 illustrate resonators 170 and 180 comprising crystals. Resonators 170 and 180 are described in my U.S. Provisional Patent Application Ser. No. 62/231,458, entitled "A Pierce Oscillator Using Three Series Inverters," filed on Jul. 6, 2015, and incorporated herein by reference.)

Resonators 170 and 180 comprise capacitances modeled as capacitors CL1 and CL2. Capacitance CL2 includes the capacitance of those of leads 116 that are coupled to lead 102, as well as any other parasitic capacitance coupled thereto.

It is noted that crystal oscillator 170 comprises an inverter 171, and crystal oscillator 180 comprises inverters 181, 182 and 183. These inverters act generally as gain elements and not binary switching elements. Therefore, they do not cause the $CV^2F$ power dissipation described above that would occur with conventional CMOS digital switching.

Signal Timing in Decoder 100

As can be seen in the timing diagram of FIG. 6, switches 120 change state at a time when resonating signal RSR is at a binary 0 voltage. This prevents any discontinuities in the voltage of the load driven by resonant circuit 104. Appropriate timing control for changing the state of switches 120 and for generating signal STRBn can be generated in any of a number of ways. For example, in one embodiment, signals $A_0$, $A_1$ and $A_2$ are generated by a microprocessor (not shown) whose quadrature clock is derived from signal RSR (i.e. whose clock is phase shifted by 90 degrees from the point where signal RSR is halfway between peak values). In such an embodiment, the microprocessor changes the state of signals $A_0$, $A_1$ and $A_2$ when signal RSR is at a binary 0 voltage.

Figure 18:
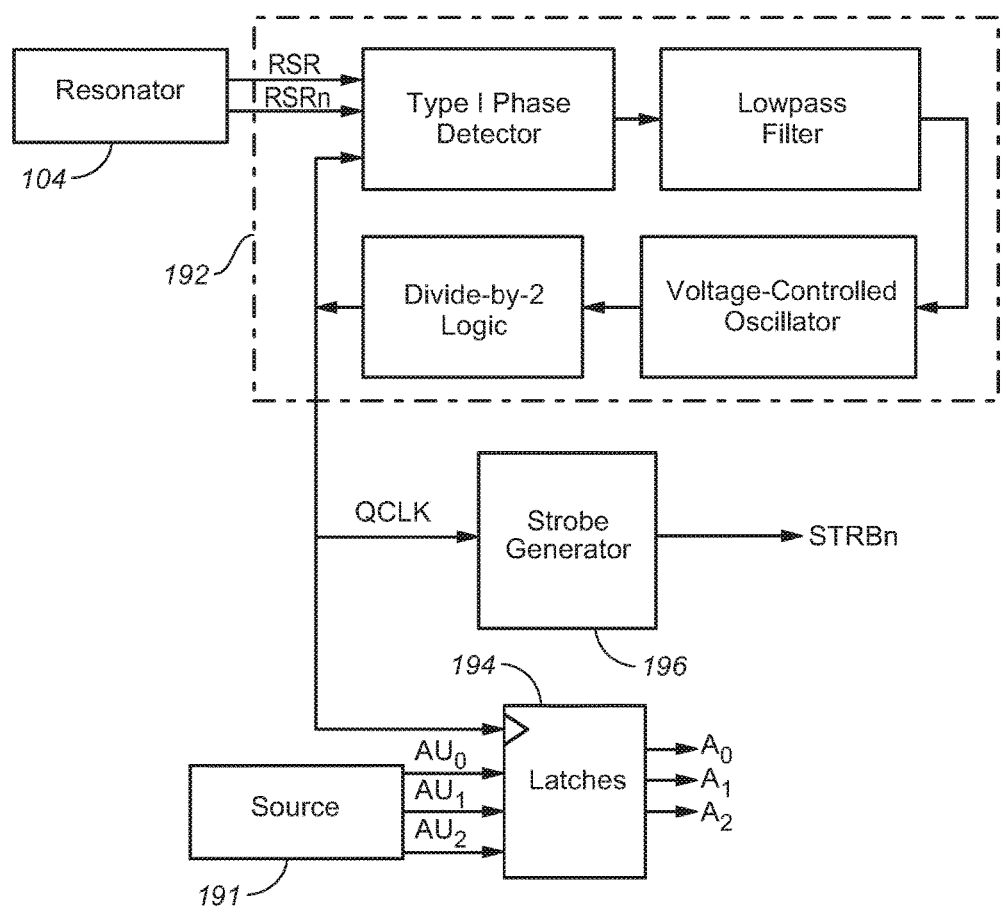
FIG. 18 illustrates an example of a circuit for generating timing signals for use with the present invention.

Alternatively, if the address information comes from a source 191 that is not synchronized with and in the correct phase relationship with signal RSR, in one embodiment a phase locked loop 192 (FIG. 18), coupled to receive sinusoidal signal RSR and its sinusoidal inverse RSRn, provides a control signal to a latch 194, which receives and latches "unretimred" signals $AU_0$, $AU_1$, and $AU_2$ to generate synchronized signals $A_0$, $A_1$ and $A_2$ at a time when signal RSR is low. The contents of latch 194 control switches 120. Alternatively, a programmable delay circuit or a delay locked loop circuit can be used in lieu of phase locked loop 192. Phase locked loops, delay locked loops and programmable delay circuits are well known in the art.

Circuitry for generating signal STRBn includes a strobe generator 196 coupled to circuit 192. Strobe generators are well-known in the art. Other techniques can also be used for generating appropriate timing signals. For an example of such strobe generation, see my U.S. Provisional Patent Application entitled "A Low Power SRAM Bitcell Using Resonant Drive Circuitry", filed Jul. 27, 2015 (Ser. No. 62/282215) and incorporated herein by reference.

Figure 8:
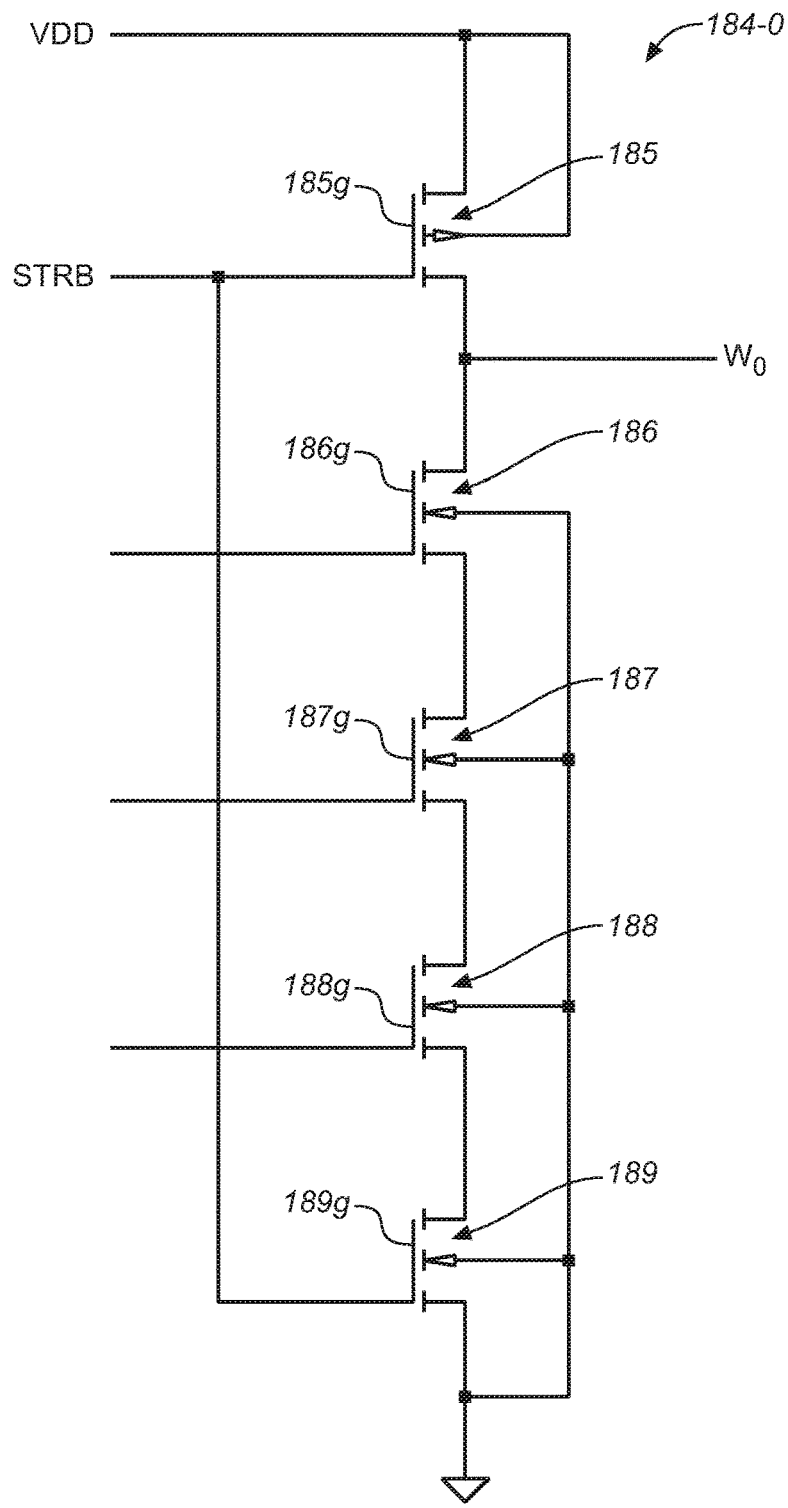
FIG. 8 illustrates an alternative embodiment of a dynamic gate for use in a decoder.

Embodiment Using One Pull-Up PMOS Transistor and Four Pull-Down NMOS Transistors In FIGS. 4 and 5, each of dynamic gates 118 include four PMOS pull-up transistors 122, 124, 126 and 128 and one pull-down transistor 130. However, in other embodiments, one can employ a dynamic gate such as dynamic gate 184-0 having one PMOS pull-up transistor 185 and four pull-down NMOS transistors 186, 187, 188 and 189 (FIG. 8). In this embodiment, strobe signal STRB is applied to the gates 185g and 189g of transistors 185 and 189. Various leads 116 are applied to gates 186g, 1872 and 188g of transistors 186, 187 and 188. In this embodiment, strobe signal STRB is a positive strobe pulse, and the signal on lead $W_0$ goes low if and only if all of the signals at gates 186g, 187g and 188g are high while strobe signal STRB is high. In other words, the polarities of the signals applied to dynamic gate 184, and its output signal on lead $W_0$ are opposite to the signals used with dynamic gates 118.

Embodiment Comprising Eight input Bits

Figure 14:
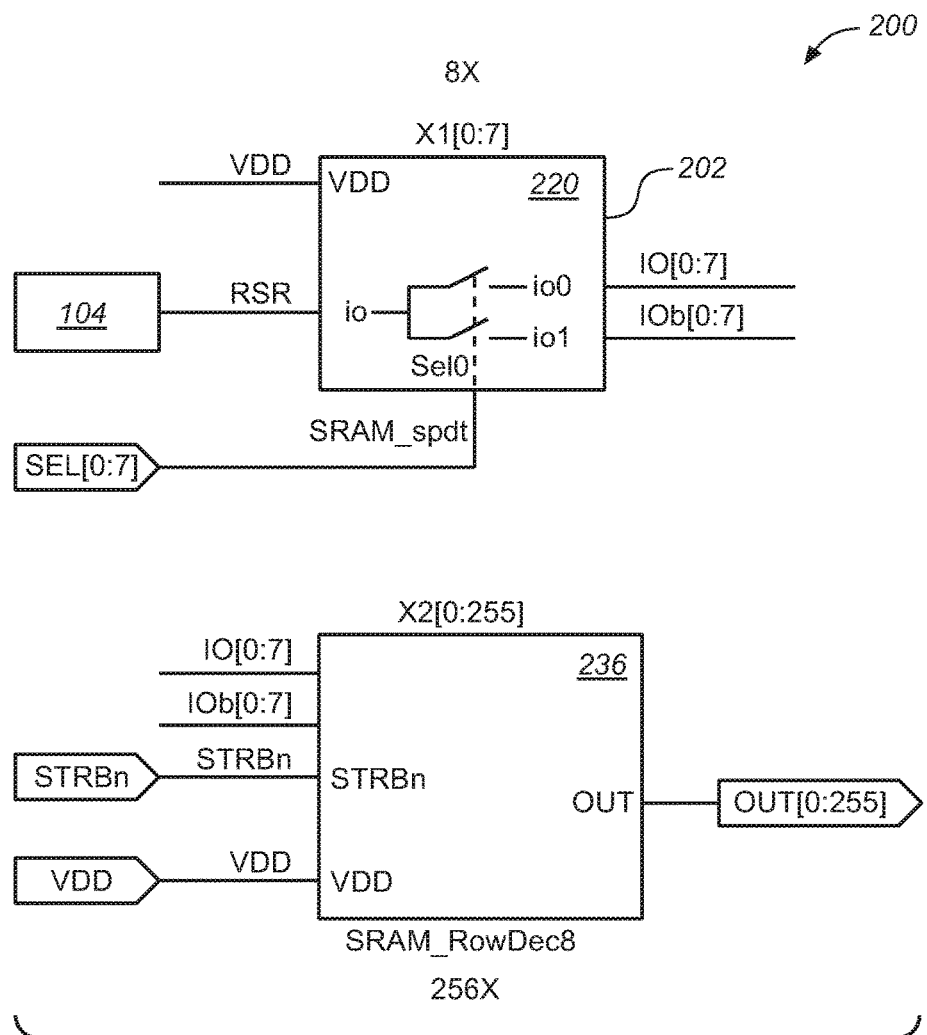
FIG. 14 is a block diagram of a novel low-power 8-to-256 decoder comprising a set of switching blocks and a set of dynamic gate pointer circuit blocks.

FIG. 14 is a block diagram showing a 8 to 256 decoder 200 that receives eight input signals $SEL_0$ to $SEL_7$ and generates therefrom 256 decoded output signals on 256 output leads $OUT_0$ to $OUT_{255}$. (In the embodiment of FIG. 14, decoder 200 operates on signals $SEL_0$ to $SEL_7$ in a manner similar to the way that decoder 100 operates on signals $A_0$ to $A_2$. Similarly, leads $OUT_0$ to $OUT_{255}$ are driven in a manner similar to leads $W_0$ to $W_7$.) Decoder 200 includes a first block 202 that receives input signals $SEL_0$ to $SEL_7$, resonating signal RSR, and Vdd and ground DC input voltages, and generates therefrom signals on eight leads $IO_0$ to $IO_7$ and eight leads $IOb_0$ to $IOb_7$. First block 202 contains eight pairs of switches 220-0 to 220-7. Each switch 220 corresponds to one of signals $SEL_0$ to $SEL_7$, one of leads $IO_0$ to $IO_7$, and one of leads $IOb_0$ to $IOb_7$. Switch 220-0 provides signal RSR to either lead $IO_0$ or $IOb_0$ depending upon the state of signal $SEL_0$. The other switches 220 perform the same function with respect to the other leads IO and IOb. Thus, switches 220 perform essentially the same function as switches 120.

Figure 15:
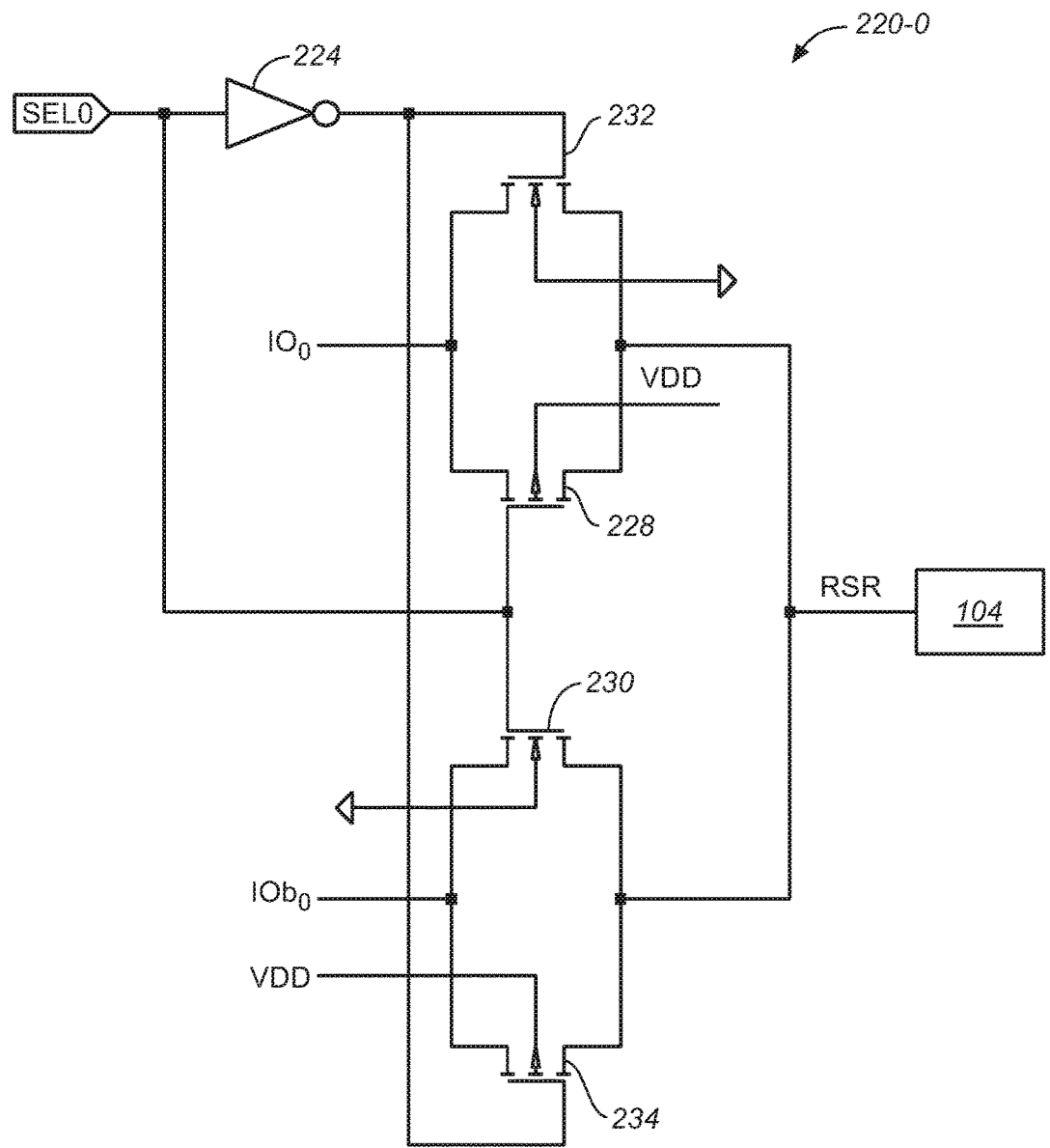
FIG. 15 is a schematic diagram of one pair of switches and its associated control circuitry within one of the switching blocks of FIG. 14.

FIG. 15 is a schematic diagram of one pair 220-0 of switches and associated control circuitry. Referring to FIG. 15, signal $SEL_0$ is provided to inverter 224, the gate of PMOS pass transistor 228 and the gate of NMOS pass transistor 230. Inverter 224 controls an NMOS pass transistor 232 and a PMOS 234. Pass transistors 228, 230, 232 and 234 couple signal RSR to either lead $IO_0$ or $IOb_0$ in response to signal $SEL_0$. The other seven pairs of switches within pairs of switches 220 are of the same configuration.

Figure 16:
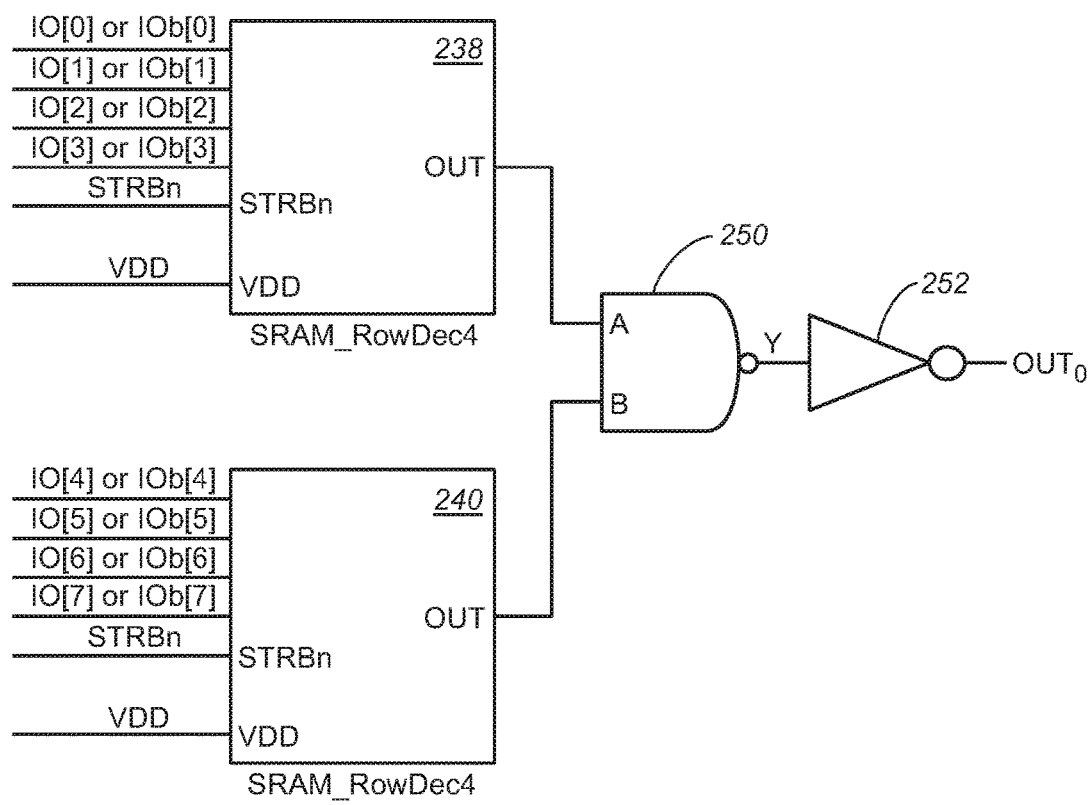
FIG. 16 illustrates two sub-blocks of dynamic gates and related logic circuitry within the dynamic gate blocks of FIG. 14.
Figure 17:
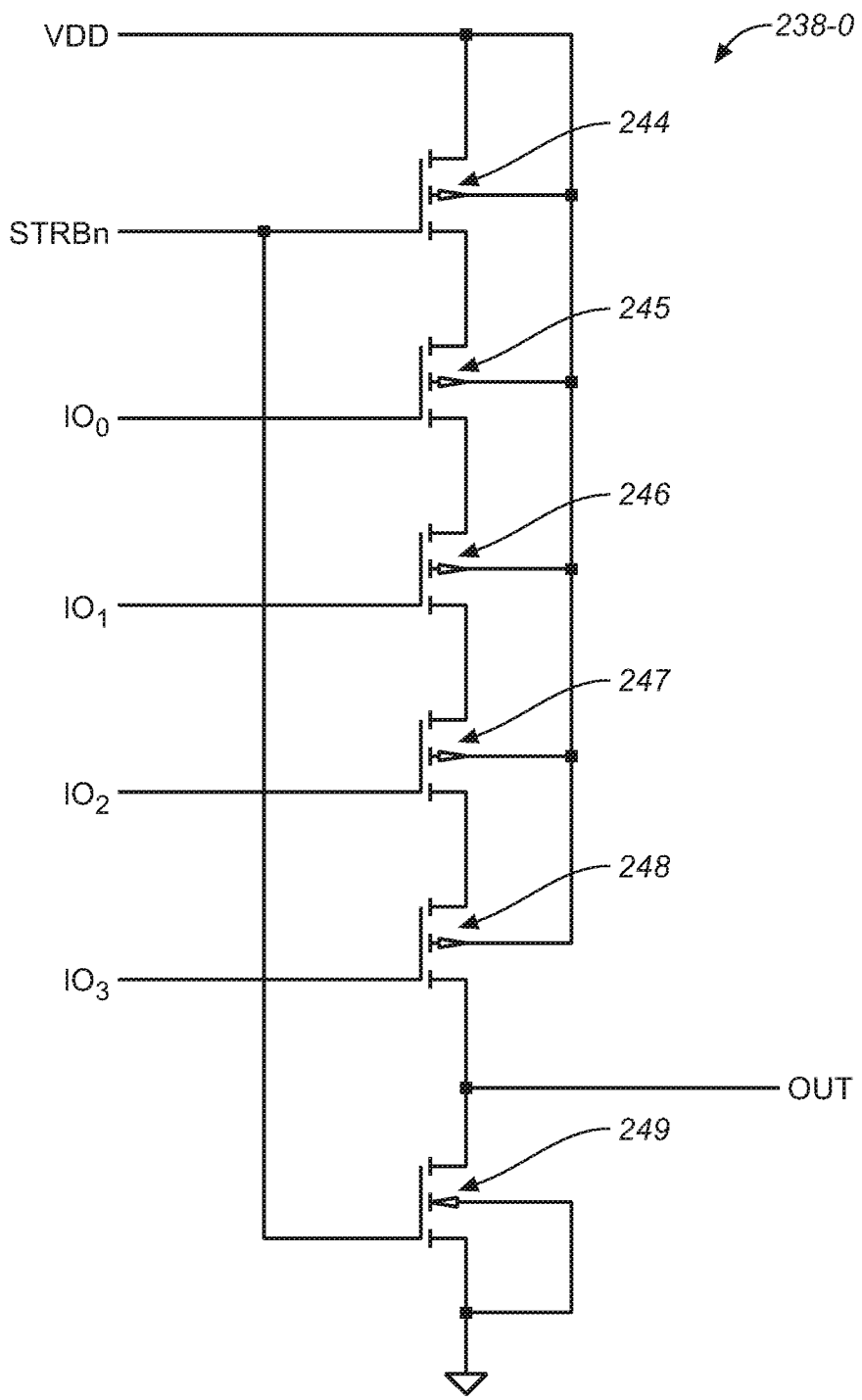
FIG. 17 illustrates a dynamic gate within one of the sub-blocks of dynamic gates of FIG. 16.

Decoder 200 also includes 256 instances of a second block 236 coupled to receive the signals from leads $IO_0$ to $IO_7$ and leads $IOb_0$ to $IOb_7$ and strobe signal STRBn, and generates therefrom 256 output signals on leads $OUT_0$ to $OUT_{255}$. Each instance of block 236 is as shown in FIG. 16. Referring to FIG. 16, each sub-block contains first and second cells 238 and 240. First cell 238 receives the signals on line $IO_0$ or $IOb_0$, $IO_1$ or $IOb_1$, $IO_2$ or $IOb_2$, and $IO_3$ or $IOb_3$. Cell 238 also receives strobe signal STRBn and input DC voltages Vdd and ground. Block 238 contains dynamic gates similar to dynamic gates 118 except the dynamic gates within block 238 has five pull-up PMOS transistors coupled in series between their output lead 242 and voltage Vdd. (An example of such a dynamic gate is dynamic gate 238-0 of FIG. 17, which comprises five pull-up PMOS transistors 244, 245, 246, 247 and 248 and one pull-down NMOS transistor 449.) Thus, the dynamic gates within block 238 perform the logical NAND function of the signals on leads $IO_0$ to $IO_3$ and $IOb_0$ to $IOb_3$ to which they are coupled when signal STRBn is active (low).

Second cell 240 is identical to cell 238 except that it receives the signals on lines $IO_4$ or $IOb_4$, $IO_5$ or $IOb_5$, $IO_6$ or $IOb_6$, and $IO_7$ or $IOb_7$ instead of the signals on lines $IO_0$ to $IO_3$ or IOb to $IOb_3$. The output signal from cells 238 and 240 are coupled to a NAND gate 250, which is in turn coupled to an inverter 252. Thus, the combination of cells 238 and 240, NAND gate 250 and inverter 252, in combination, perform the logical NAND function on the signals on the combination of IO and IOb lines to which they are coupled when signal STRBn is active (low) and serve as a pointer circuit.

As mentioned above, there are 256 instances of block 236, arranged to perform the logical NAND function on the 256 permutations of combinations of lines IO and IOb when signal STRBn is low. Thus, the 256 instances of block 236 generate output signals on leads $OUT_0$ to $OUT_{255}$ to thereby perform an 8 to 256 decode function on signals $SEL_0$ to $SEL_7$.

The main differences between decoders 100 and 200 are 1) decoder 100 is a 3 to 8 decoder and decoder 200 is an 8 to 256 decoder; and 2) the decoder gates in decoder 200 are divided into two 5-input dynamic gates whose output signals are ANDed together, whereas the decoder gates in decoder 100 are not divided. The gates of decoder 200 are divided to avoid the inherent delay associated with stacking more than five devices in series. However, in other embodiments, other numbers of CMOS gate input leads can be used. In addition, in other embodiments, there are more than two NAND gates in each decoder sub-block. In other words, instead of having two sub-blocks within block 236, there can be more sub-blocks that are ANDed together.

Embodiments Using Different Types of Logic Gates and in Conjunction with PALs and PLA The embodiments described above use a set of CMOS dynamic gates that perform the logical NAND function. However, it will be appreciated that decoders can also be implemented using other types of circuits, e.g. actual CMOS NAND gates. (In such embodiments, it is desirable to use a strobe signal to minimize power consumption when signal RSR is not at its peak values.) In other embodiments, pointer circuits or CMOS logic circuits that perform NOR, AND or OR functions can also be used.

While the invention can be incorporated in an SRAM as part of an address decoder, it can also be incorporated in other circuits that include a set of lines that are each coupled to a set of gates. For example, PLAs, GALS and PALS typically comprise a bus carrying inverted and non-inverted input signals. The bus is coupled to a first set of gates, the output signals of which are coupled to a second set of gates. (The first set of gates can be AND gates, whereas the second set of gates can be OR gates. Alternatively, in other types of PLAs and PALs, the first and second sets of gates are both NAND gates. Typically, the connections between the bus and the first set of gates are either mask or electrically programmable.) PLAs and PALs are described in U.S. Pat. No. 4,758,746, issued to Birkner et al. on Jul. 19, 1988, incorporated herein by reference.

In a PAL, GAL or PLA the first set of gates functions as a decoder. In accordance with an embodiment of my invention, a portion of the input leads of the gates within the first set of gates is driven by a resonant circuit and a strobe signal.

While the invention has been described in detail concerning specific embodiments, those skilled in the art will recognize that changes can be made in form and detail without departing from the spirit and scope of the invention. For example, the decoder of the present invention can be used in conjunction with arrays having different numbers of rows. The decoder can either fully decode or partially decode the input signals. In one embodiment, the decoder is used in conjunction with an SRAM as described in my above-mentioned provisional patent application entitled "A Low Power SRAM Bitcell Using Resonant Drive Circuitry". Further, the decoder can be used with memories other than SRAMs, e.g. DRAMs, ROMs or EEPROMs. Further, the decoder can be used in conjunction with circuits other than memories. The decoder can be implemented in CMOS, NMOS, PMOS or other technologies. The DC power supply voltages and binary voltage levels are typically 0 and 3 volts, and resonating signal RSR oscillates between 0 and 3 volts, but in other embodiments, other voltage levels are used. For embodiments using crystal resonators, different types of resonating materials can be used (e.g. quartz, a ceramic material, or the materials described in U.S. Pat. No. 7,183,868, issued to Wessendorf, col. 7, lines 6-24, incorporated herein by reference). Accordingly, all such changes come within the present invention.

I claim:
1. A decoder comprising:
    a set of input leads for receiving input signals;
    a set of intermediate leads;
    a resonant circuit for generating a resonating signal;
    a set of pairs of switches, each pair of switches being associated with a first and a second one of said intermediate leads and an input lead, each pair of switches coupling either said first associated intermediate lead or said second associated intermediate lead to receive said resonating signal in response to the input signal associated with said pair of switches; and
    a set of pointer circuits coupled to said intermediate leads for generating a set of decoded output signals corresponding to the signals on the input leads, the intermediate leads that are not coupled to receive the resonating signal being held at a first binary voltage.
2. Decoder of claim 1 further coupled to receive a strobe signal, said pointer circuits performing a logic function on the signals on said intermediate leads when said strobe signal is asserted, said strobe signal being asserted when the resonating signal is at a second binary voltage opposite said first binary voltage.
3. Decoder of claim 2 wherein said intermediate leads exhibit capacitance and said resonating signal resonates at a frequency, the capacitance of said intermediate leads cooperating with said resonating circuit to thereby influence the frequency of the resonating signal.
4. Decoder of claim 3 further comprising a circuit for holding the intermediate leads at said first binary voltage when they are not coupled to receive the resonating signal.
5. Decoder of claim 3 wherein the capacitance of said intermediate leads cooperating with said resonating circuit remains substantially constant when said input signals change.
6. Decoder of claim 2 wherein said intermediate leads exhibit capacitance, the capacitance of said intermediate leads enabling said resonating circuit to resonate.
7. Method comprising:
    providing a set of input signals;
    coupling a selected subset of intermediate lines to receive a resonating signal in response to said input signals, unselected intermediate lines being at a first binary voltage; and performing a binary logic function on said intermediate lines when the resonating signal is at a second voltage opposite said first binary voltage to thereby decode said input signals.

8. Method of claim 7 further comprising holding said intermediate lines at said first binary voltage when they are not receiving the resonating signal.

9. Method of claim 7 further comprising generating said resonating signal with a resonating circuit.

10. Method of claim 9 wherein the resonating signal resonates at a frequency, said method further comprising maintaining capacitance coupled to said resonating circuit substantially constant such that the frequency of said resonating signal remains substantially constant.

11. Method of claim 9 wherein the intermediate lines coupled to said resonating circuit exhibit capacitance, and the capacitance of the intermediate lines coupled to said resonating circuit enable said resonating circuit to resonate.

12. Method of claim 7 wherein said performing a binary logic function on said intermediate lines is accomplished with a pointer circuit coupled to said intermediate lines for generating a decoded output signal corresponding to the input signals.

* * * * *